United States Patent
Xu et al.

(10) Patent No.: US 11,621,683 B2
(45) Date of Patent: Apr. 4, 2023

(54) CURRENT SENSING CIRCUITRY

(71) Applicant: Cirrus Logic International Semiconductor Ltd., Edinburgh (GB)

(72) Inventors: Wei Xu, Austin, TX (US); Ravi Kummaraguntla, Austin, TX (US); Paul Wilson, Linlithgow (GB); Mujo Kozak, Austin, TX (US); Christian Larsen, Austin, TX (US); John L. Melanson, Austin, TX (US); Yongjie Cheng, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 62 days.

(21) Appl. No.: 17/162,229

(22) Filed: Jan. 29, 2021

(65) Prior Publication Data

US 2022/0247372 A1 Aug. 4, 2022

(51) Int. Cl.
H03F 3/45 (2006.01)

(52) U.S. Cl.
CPC ..... *H03F 3/45479* (2013.01); *H03F 3/45179* (2013.01); *H03F 3/45183* (2013.01); *H03F 3/45659* (2013.01)

(58) Field of Classification Search
CPC ............. H03F 3/45479; H03F 3/45179; H03F 3/45183; H03F 3/45192; H03F 3/45089; H03F 3/45659; H03F 3/45475; H03F 3/45
USPC .................................................. 330/253, 258
See application file for complete search history.

(56) References Cited

U.S. PATENT DOCUMENTS

| | | | |
|---|---|---|---|
| 6,697,001 B1* | 2/2004 | Oliaei | H03M 3/356 327/552 |
| 8,229,382 B2* | 7/2012 | Mak | H03G 1/04 330/254 |
| 10,955,691 B2* | 3/2021 | Vera Villarroel | H03F 3/45973 |
| 2013/0147548 A1* | 6/2013 | Ikeda | H03F 1/34 330/75 |
| 2015/0263676 A1* | 9/2015 | Lu | H03F 3/185 330/260 |
| 2016/0079942 A1* | 3/2016 | Li | H04B 1/16 330/261 |
| 2019/0229738 A1 | 7/2019 | Werner et al. | |
| 2020/0304076 A1 | 9/2020 | Lipka et al. | |

OTHER PUBLICATIONS

International Search Report and Written Opinion of the International Searching Authority, International Application No. PCT/US2021/064169, dated Apr. 14, 2022.
Horowitz, P. et al., "The Art of Electronics Passage Tekst", Art of Electronics, Cambridge, Jan. 1, 1980, pp. 279-286, Cambridge University Press, GB.

* cited by examiner

*Primary Examiner* — Khanh V Nguyen
(74) *Attorney, Agent, or Firm* — Jackson Walker L.L.P.

(57) ABSTRACT

A system may include a front end differential amplifier having two input terminals, two input resistors, each of the two input resistors coupled to a respective one of the two input terminals, and an input common mode biasing circuit for an output stage of the front end differential amplifier, the input common mode biasing circuit comprising two current sources configured to generate currents for biasing the output stage of the front end differential amplifier.

26 Claims, 3 Drawing Sheets

CURRENT SENSING CIRCUITRY

FIELD OF DISCLOSURE

The present disclosure relates to current sense amplifiers. More specifically, portions of this disclosure relate to calibration of a current sense amplifier having common-mode rejection.

BACKGROUND

A current sense amplifier system may sense a current using a sense resistor with a small resistance to generate a small sense voltage across the terminals of the sense resistor that is proportional to the sensed current. An amplifier of the current sense amplifier system may be used to amplify the small sense voltage and an analog-to-digital converter (ADC) may convert the analog sensed voltage signal to a digital sensed voltage signal suitable for digital post-processing.

Three major factors may affect the accuracy of a current sensor system: offset, noise, and common mode rejection. Offset performance of the current sensor system is often addressed by techniques such as chopping, calibration, and/ or using large devices within the sensor system. Similarly, noise performance could be improved by using large devices or by increasing the power consumption of the underlying circuitry. Common mode rejection, on the other hand, may be more challenging to achieve especially when the performance needs to be maintained over a large common mode range. In a power converter application (e.g., where a current sensor system is used to measure an output current of a battery or other power source that is converted by a power converter), common mode components may easily overwhelm the offset and noise and may become the most dominant noise contributor.

FIGS. 1 and 2 depict two common current sensor topologies traditionally utilized in the art. In both topologies, a current sensing amplifier system comprising a sense amplifier 2, an anti-aliasing filter 4, and an analog-to-digital converter (ADC) 6 may be used to sense a voltage (e.g., $V_{BAT}-V_{DD\_SENSE}$) across a sense resistor 8, wherein such voltage may be approximately proportional to a current $I_{SENSE}$ flowing through sense resistor 8. Common mode rejection in the topology shown in FIG. 1 may be limited by matching of resistances (e.g., resistances $R_P$ and $R_N$) of input resistors 10A and 10B. The topology shown in FIG. 2 may address this resistor mismatch issue by using feedback (e.g., with transistors 12A and 12B) between the input terminals and output terminals of sense amplifier 2. However, common mode rejection of the topology shown in FIG. 2 may be limited by a bandwidth of sense amplifier 2. In addition, although feedback in the topology of FIG. 2 may reduce the limitations to common mode rejection resulting from mismatch of input resistors 10A and 10B, such topology may not fully eliminate the mismatch issue. Moreover, the common mode rejection of both topologies shown in FIGS. 1 and 2 may degrade significantly as the input common mode voltage of sense resistor 8 decreases.

SUMMARY

In accordance with the teachings of the present disclosure, one or more disadvantages and problems associated with existing approaches to measuring current using a current sense amplifier may be reduced or eliminated.

In accordance with embodiments of the present disclosure, a system may include a front end differential amplifier having two input terminals, two input resistors, each of the two input resistors coupled to a respective one of the two input terminals, and an input common mode biasing circuit for an output stage of the front end differential amplifier, the input common mode biasing circuit comprising two current sources configured to generate currents for biasing the output stage of the front end differential amplifier.

In accordance with these and other embodiments of the present disclosure, a method may be provided, for a system comprising a front end differential amplifier having two input terminals, and two input resistors, each of the two input resistors coupled to a respective one of the two input terminals. The method may include generating, with two current sources of an input common mode biasing circuit for an output stage of the front end differential amplifier, currents for biasing the output stage of the front end differential amplifier.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

This present disclosure addresses the challenge of common mode rejection of traditional topologies for current sensing, as described in the Background section, above. For example, systems and methods disclosed herein may employ a floating supply domain for a sensor front-end of a current sensing system. In addition, the present disclosure may include several enhancements for improving offset performance, as compared to traditional approaches, of a sensor in the presence of device mismatches.

Figure 3:
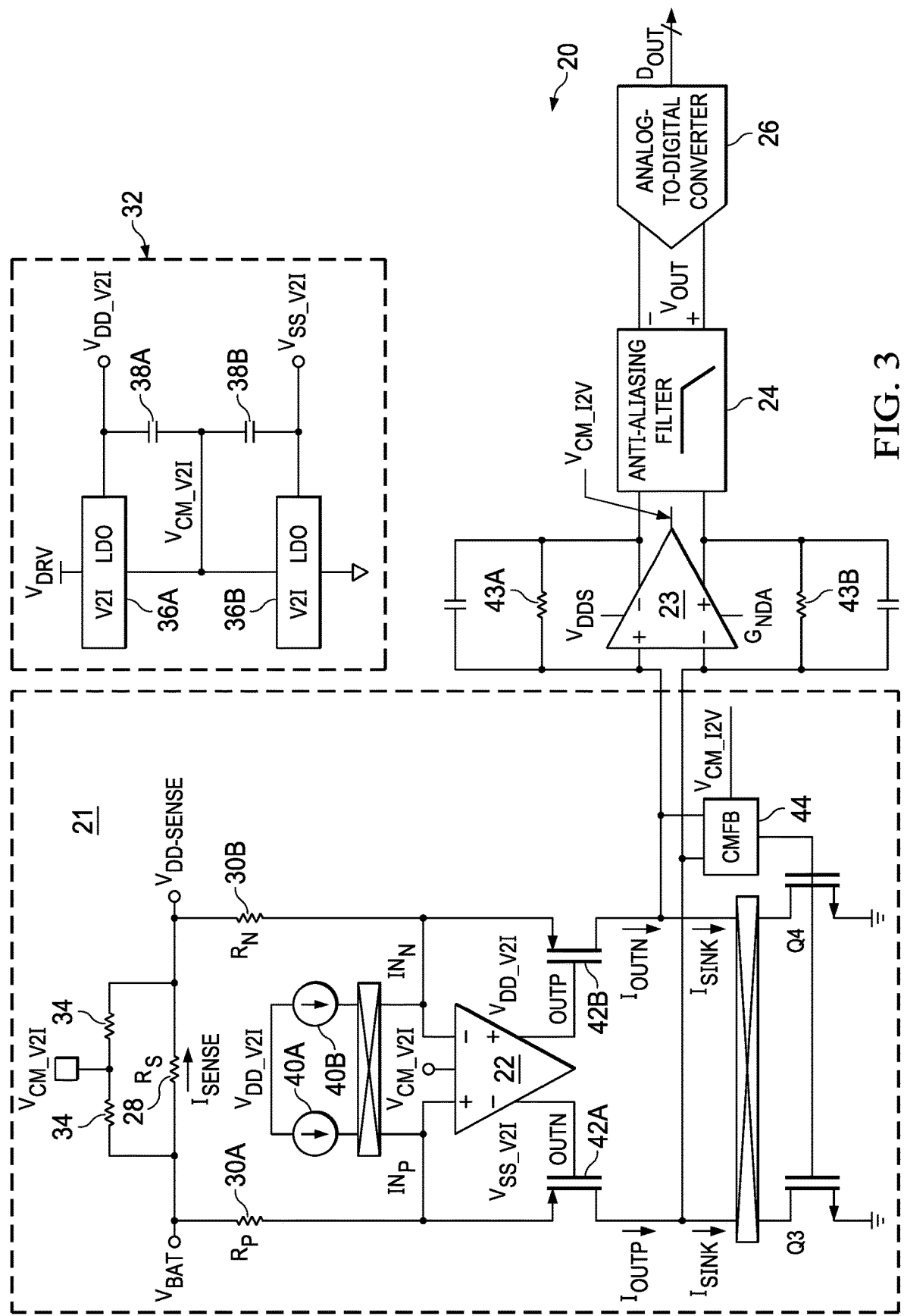
FIG. 3 illustrates an improved example current sensor topology, in accordance with embodiments of the present disclosure.

FIG. 3 illustrates an improved current sensor system 20, in accordance with embodiments of the present disclosure. As shown in FIG. 3, current sensor system 20 may include a front end 21 including a voltage-to-current (V2I) sense amplifier 22 configured to generate a differential current (e.g., $I_{OUTP}-I_{OUTN}$) proportional to a voltage (e.g., $V_{BAT}-V_{DD\_SENSE}$) across a sense resistor 28, wherein such voltage may be approximately proportional to a current $I_{SENSE}$ flowing through sense resistor 28. Current sensor system 20 may also include a current-to-voltage (I2V) amplifier 23 configured to convert the differential current generated by sense amplifier 22 into an equivalent differential voltage, which may be filtered by an anti-aliasing filter 24 to generate an analog output voltage $V_{OUT}$. Current sensor system 20 may further include an ADC 26 to convert analog output voltage $V_{OUT}$ into an equivalent digital output signal $D_{OUT}$ indicative of current $I_{SENSE}$.

Further as shown in FIG. 3, current sensor system 20 may include a floating supply domain 32 for providing power supply rails $V_{DD\_V2I}$ and $V_{SS\_V2I}$ to sense amplifier 22. Floating supply domain 32 may be derived from a common mode voltage $V_{CM\_V2I}$ of sense resistor 28, and as a consequence, supply rails $V_{DD\_V2I}$ and $V_{SS\_V2I}$ of sense amplifier 22 may be boot-strapped to the common mode voltage $V_{CM\_V2I}$ of the voltage signal (e.g., $V_{BAT}-V_{DD\_SENSE}$) sensed across sense resistor 28. Thus, as common mode voltage $V_{CM\_V2I}$ varies, supply rails $V_{DD\_V2I}$ and $V_{SS\_V2I}$ of sense amplifier 22 may vary accordingly, increasing (as compared to traditional approaches) immunity of sense amplifier 22 to common mode variations.

As shown in FIG. 3, common mode voltage $V_{CM\_V2I}$ may be detected using two series resistors 34 arranged in parallel with sense resistor 28. Floating supply domain 32 may include a first low-dropout (LDO) regulator 36A which may use common mode voltage $V_{CM\_V2I}$ as a reference voltage to generate positive supply rail $V_{DD\_V2I}$ of sense amplifier 22. Floating supply domain 32 may include a second LDO regulator 36B which may use common mode voltage $V_{CM\_V2I}$ as a reference voltage to generate negative supply rail $V_{SS\_V2I}$ of sense amplifier 22. LDOs regulator 36A and 36B may use error amplifiers (not depicted in FIG. 3) to compare common mode voltage $V_{CM\_V2I}$ with the supply voltage (e.g., $V_{DD\_V2I}-V_{SS\_V2I}$) of sense amplifier 22 and ensure that any low-frequency changes in common mode voltage $V_{CM\_V2I}$ are accurately reflected on supply rails $V_{DD\_V2I}$ and $V_{SS\_V2I}$ of sense amplifier 22. In order to provide for common mode rejection over a wide bandwidth, floating supply domain 32 may include a decoupling capacitor 38A coupled between the output of first LDO regulator 36A and common mode voltage $V_{CM\_V2I}$ and a decoupling capacitor 38B coupled between the output of second LDO regulator 36B and common mode voltage $V_{CM\_V2I}$. These decoupling capacitors 38A and 38B may create an alternating current (AC) bootstrapping path from common mode voltage $V_{CM\_V2I}$ to sense amplifier 22 to ensure that high-frequency variations on common mode voltage $V_{CM\_V2I}$ propagate to supply rails $V_{DD\_V2I}$ and $V_{SS\_V2I}$ of sense amplifier 22.

Figure 1:
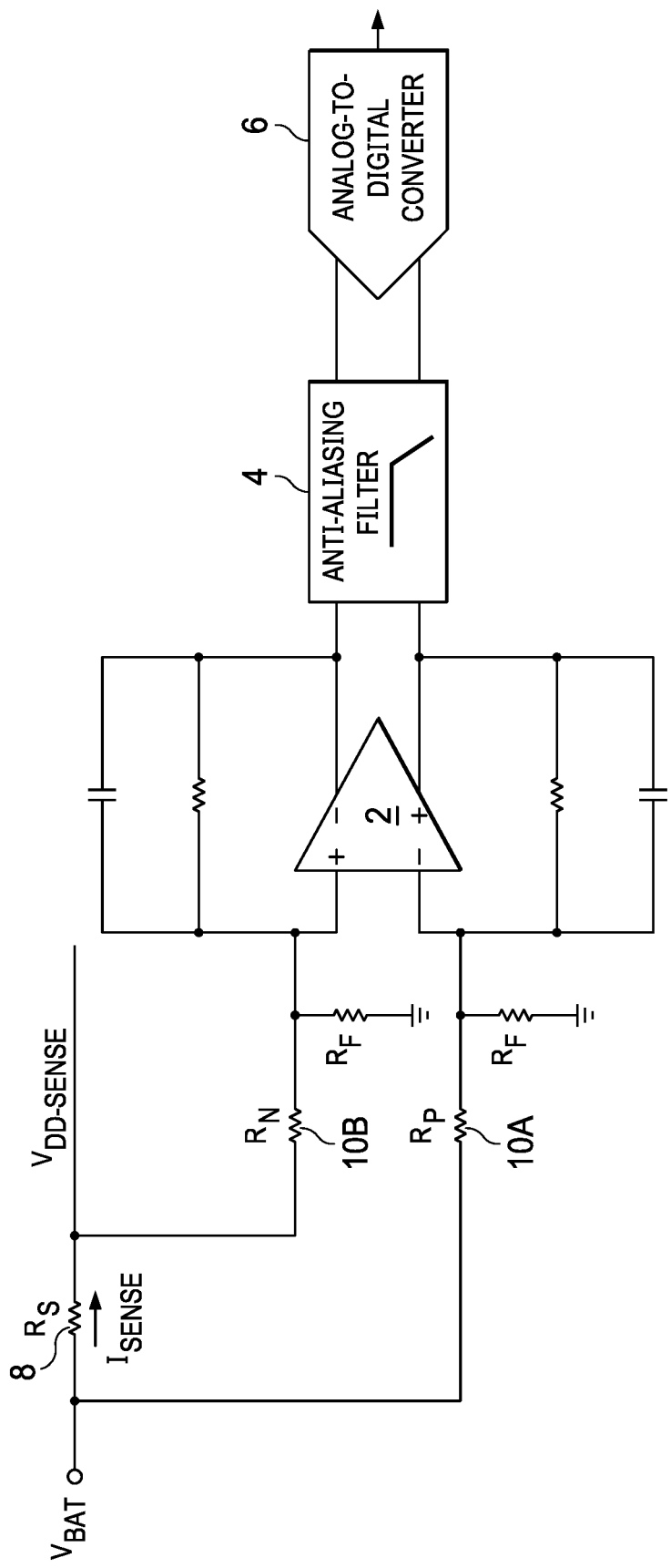
FIG. 1 illustrates an example current sensor topology, as is known in the art.
Figure 2:
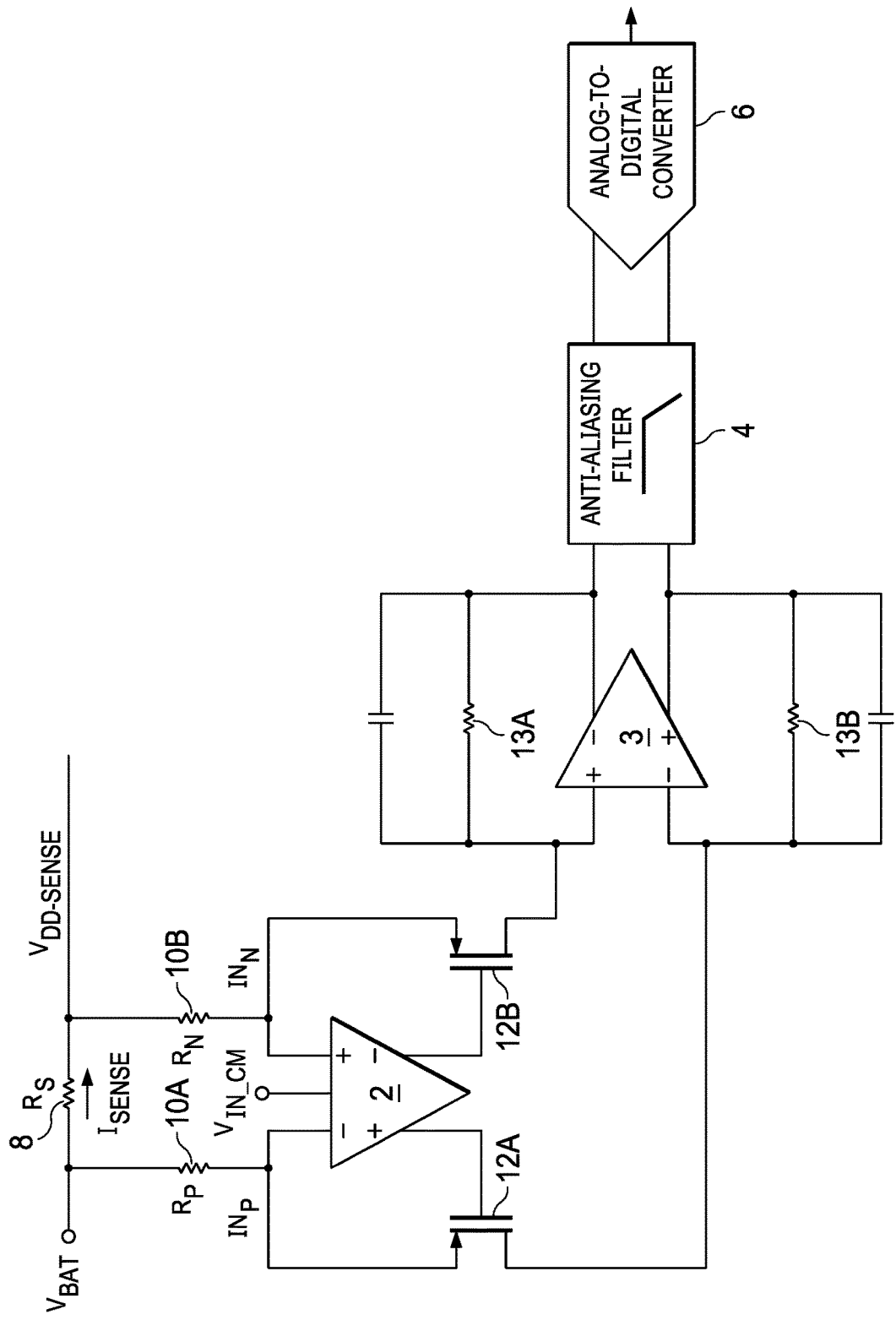
FIG. 2 illustrates another example current sensor topology, as is known in the art.

In addition to providing wide-band common mode rejection using floating supply domain 32 as described above, current sensor system 20 may also reduce (as compared to traditional approaches) dependence of offset on device matching (e.g., matched resistances $R_P$ and $R_N$ of input resistors 30A and 30B, respectively). This enhancement of current sensor system 20 may be understood by examining a disadvantage of the topology shown in FIG. 2. In the topology of FIG. 2, when the differential voltage across sense resistor 8 is zero (e.g., $V_{BAT}-V_{DD\_SENSE}=0$), the common mode feedback of sense amplifier 2 may cause virtual ground nodes $IN_P$ and $IN_N$ to be at the same voltage potential. However, to maintain feedback transistors 12A and 12B in their active regions of operation, it may be necessary to maintain a bias current flowing through feedback transistors 12A and 12B at all times. In the topology of FIG. 2, such bias current may be drawn from the inputs of the sensor system, thus creating a constant bias current flowing through input resistors 10A and 10B. In order to avoid creating a differential offset, the bias current flowing through input resistors 10A and 10B must be exactly identical. However, because such bias current is dependent on the voltage difference between the terminals of sense resistor 8 and virtual ground nodes $IN_P$ and $IN_N$, as well as resistances $R_P$ and $R_N$, any device mismatches may result in a differential offset in the sensed current. For example, if $V_{BAT}=V_{SS\_SENSE}$ and $IN_P=IN_N$, mismatches between resistances $R_P$ and $R_N$ may create a differential current in the circuit of FIG. 2 and thus generate an undesirable measurement offset.

The problem of such offset may be overcome at least in part by the presence of current sources 40A and 40B shown in FIG. 3. Current sources 40A and 40B may be configured to generate electrical currents sufficient to maintain feedback transistors 42A and 42B in their active regions of operation. Accordingly, in current sensor system 20, when $V_{BAT}=V_{DD\_SENSE}$ and $IN_P=IN_N$, no bias current may flow through input resistors 30A and 30B, and thus differential offset within current sensor system 20 may be reduced (as compared to traditional approaches) or eliminated.

Another advantage of current sensor system 20 is that it may be insensitive to polarity of sensed current $I_{SENSE}$, thus minimizing a zero-crossing dead zone in measurement operation. This enhancement of current sensor system 20 may also be understood by examining another disadvantage of the topology shown in FIG. 2. For example, consider that in the topology of FIG. 2, a differential voltage across sense resistor 8 generates a current through either of input resistors 30A and 30B depending on a common mode voltage of virtual ground nodes $IN_P$ and $IN_N$. Such scenario may inherently limit detection to a single polarity of sensed current $I_{SENSE}$, and when used in conjunction with another such sensor designed for the opposite polarity, creates a dead zone in current measurement near zero.

Such problem of a zero-crossing dead zone may be reduced or eliminated in current sensor system 20 by at least two features of current sensor system 20. First, virtual ground nodes $IN_P$ and $IN_N$ of current sensor system 20 may be controlled to equal common mode voltage $V_{CM\_V2I}$ of sense resistor 28. Hence, the differential voltage across sensor resistor 28 may be distributed equally and with opposite polarity between input resistors 30A and 30B. Second, biasing by current sources 40A and 40B may ensure that feedback transistors 42A and 42B are maintained in their active regions of operation, further ensuring that no dead zone occurs at the zero crossing of sensed current $I_{SENSE}$. These two features may render current sensor system 20 highly immune to differential signal polarity and may enable sensing transition from one polarity to the other with minimal crossover distortion.

Current sensor system 20 may also include a common mode feedback (CMFB) circuit 44 at the inputs of I2V amplifier 23, as shown in FIG. 3. The advantage of CMFB 44 may be understood by examining another disadvantage of the topology shown in FIG. 2. In the topology of FIG. 2, the differential voltage signal across sense resistor 8 may be converted into a differential current flowing through input resistors 10A and 10B. Such differential current may flow through feedback transistors 12A and 12B and may be converted back to the voltage domain by I2V amplifier 3 and its feedback resistors 13A and 13B. As explained earlier, any mismatch between input resistors 10A and 10B may lead to a differential offset in the sensed current signal. Similarly, any mismatch in feedback resistors 13A and 13B may create a differential offset in the sensed current signal.

To reduce or eliminate the problem of differential offset occurring at the transimpedance (e.g., I2V) stage, current sensor system 20 may include CMFB circuit 44 at the virtual grounds of I2V amplifier 23. CMFB circuit 44 at the virtual grounds of I2V amplifier 23 in combination with common mode voltage feedback at the output of I2V amplifier 23 may ensure that no common mode current flows through feedback resistors 43A and 43B of I2V amplifier 23. Thus, compared to traditional approaches, the presence of CMFB circuit 44 may improve offset performance of I2V amplifier 23 in the presence of resistor mismatches and may further reduce overall offset in the sensed current.

Further, by using separate current sources 40A and 40B to bias input resistors 30A and 30B, current sensor system 20 may enable automatic testing and/or automatic calibration of the current sensing path. The need for such a calibration may be appreciated by noting that, in most applications using a battery as a source of energy, a current sensor may need to support a very wide dynamic range (e.g., as high as 100 decibels). For example, a typical battery current sensor may need to detect currents as low as 1 mA and as high as 40A. This requirement may pose challenges in designing and testing a current sensor. On a low end of a current range, accuracy of current sensor system 20 may be limited by offset and noise performance of the analog circuitry and test equipment. On the high end of the current range, accuracy may be limited by nonlinear performance of the analog circuitry and test equipment.

As set forth above, the systems and methods disclosed herein may, compared to traditional approaches, improve the offset performance of the current sensing system 20 via different circuit techniques. In addition to such improvements, the methods and systems described herein may provide a way to digitally calibrate a residual offset without having to inject any external signals into current sensing system 20. To illustrate, it can be seen from FIG. 3 that currents generated by current sources 40A and 40B may provide a parallel path to inject a signal into front end 21 of current sensing system 20. Hence, even with zero current flowing through sense resistor 28, a known differential or common mode current could be injected into front end 21. Such feature may enable various calibration and test procedures needed to improve or measure performance of current sensing system 20. For example, in order to perform analog offset calibration, a calibration subsystem (not explicitly shown) may short nodes for voltages $V_{BAT}$ and $V_{DD\_SENSE}$ together, and the currents generated by current sources 40A and 40B may be differentially varied until a residual offset measured at the output of current sensing system 20. Similarly, linearity of the current sensing system 20 may be improved by using a digital-to-analog converter (not shown) to create currents generated by current sources 40A and 40B. Because currents generated by current sources 40A and 40B may be much lower than the currents flowing through sense resistor 28, such an approach may greatly simplify production test setup and may essentially eliminate the need for high current testing. Moreover, by using an accurate on-chip digital-to-analog converter to generate currents generated by current sources 40A and 40B, linearity performance may be measured and calibrated without the need for any external test equipment. This feature enables a capability to perform either background calibration or on-the-field calibration of the analog circuitry of current sensing system 20.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a front end differential amplifier having two input terminals;
   two input resistors, each of the two input resistors coupled to a respective one of the two input terminals;
   an input common mode biasing circuit for an output stage of the front end differential amplifier, the input common mode biasing circuit comprising two current sources configured to generate currents for biasing the output stage of the front end differential amplifier;

a back end differential amplifier coupled to the output stage of the front end differential amplifier;

an output common mode biasing circuit for an output stage of the back end differential amplifier; and a common mode feedback circuit coupled to virtual grounds of the back end differential amplifier in order to minimize common mode current flowing through feedback resistors of the back end differential amplifier.

2. The system of claim 1, wherein the two input terminals of the front end differential amplifier are configured to receive an input signal via the two input resistors, wherein the input signal is generated by a sense resistor.

3. The system of claim 2, further comprising circuitry for detecting a common mode voltage of the sense resistor.

4. The system of claim 1, wherein the output stage of the front end differential amplifier is independently biased to maintain insensitivity to current flowing through the two input resistors.

5. The system of claim 1, wherein the output stage of the front end differential amplifier is independently biased to minimize distortion caused by changing polarity of an input signal received by the front end differential amplifier.

6. The system of claim 1, further comprising a digital-to-analog converter to generate the currents for biasing the output stage of the front end differential amplifier.

7. The system of claim 6, wherein the currents for biasing the output stage of the front end differential amplifier enable calibration of an offset of the system.

8. The system of claim 6, wherein the currents for biasing the output stage of the front end differential amplifier enable calibration of non-linearity of the system.

9. A system comprising:

a front end differential amplifier having two input terminals;

two input resistors, each of the two input resistors coupled to a respective one of the two input terminals, wherein the two input terminals of the front end differential amplifier are configured to receive an input signal via the two input resistors, wherein the input signal is generated by a sense resistor;

an input common mode biasing circuit for an output stage of the front end differential amplifier, the input common mode biasing circuit comprising two current sources configured to generate currents for biasing the output stage of the front end differential amplifier; and circuitry for detecting a common mode voltage of the sense resistor, wherein supply rails for the front end differential amplifier are generated based on the common mode voltage.

10. The system of claim 9, further comprising:

a back end differential amplifier coupled to an output of the front end differential amplifier; and an output common mode biasing circuit for an output stage of the back end differential amplifier.

11. The system of claim 9, further comprising supply regulators configured to generate the supply rails for the front end differential amplifier, wherein a reference voltage for the supply regulators is set based on the common mode voltage.

12. The system of claim 11, wherein the supply rails are alternating-current coupled to the common mode voltage.

13. A system comprising:

a front end differential amplifier having two input terminals;

two input resistors, each of the two input resistors coupled to a respective one of the two input terminals, wherein the two input terminals of the front end differential amplifier are configured to receive an input signal via the two input resistors, wherein the input signal is generated by a sense resistor;

an input common mode biasing circuit for an output stage of the front end differential amplifier, the input common mode biasing circuit comprising two current sources configured to generate currents for biasing the output stage of the front end differential amplifier; and circuitry for detecting a common mode voltage of the sense resistor, wherein a reference voltage for virtual grounds of the front end differential amplifier are set based on the common mode voltage.

14. A method in a system comprising a front end differential amplifier having two input terminals, a back end differential amplifier coupled to an output of the front end differential amplifier, and two input resistors, each of the two input resistors coupled to a respective one of the two input terminals, the method comprising:

generating, with two current sources of an input common mode biasing circuit for an output stage of the front end differential amplifier, currents for biasing the output stage of the front end differential amplifier;

biasing an output stage of the back end differential amplifier with an output common mode biasing circuit; and minimizing common mode current flowing through feedback resistors of the back end differential amplifier with a common mode feedback circuit coupled to virtual grounds of the back end differential amplifier.

15. The method of claim 14, wherein the two input terminals of the front end differential amplifier are configured to receive an input signal via the two input resistors, wherein the input signal is generated by a sense resistor.

16. The method of claim 15, further comprising detecting a common mode voltage of the sense resistor.

17. The method of claim 14, further comprising independently biasing the output stage of the front end differential amplifier to independently maintain insensitivity to current flowing through the two input resistors.

18. The method of claim 14, further comprising independently biasing the output stage of the front end differential amplifier to minimize distortion caused by changing polarity of an input signal received by the front end differential amplifier.

19. The method of claim 14, further comprising generating the currents for biasing the output stage of the front end differential amplifier with a digital-to-analog converter.

20. The method of claim 19, wherein the currents for biasing the output stage of the front end differential amplifier enable calibration of an offset of the system.

21. The method of claim 19, wherein the currents for biasing the output stage of the front end differential amplifier enable calibration of non-linearity of the system.

22. A method in a system comprising a front end differential amplifier having two input terminals, and two input resistors, each of the two input resistors coupled to a respective one of the two input terminals, and wherein the two input terminals of the front end differential amplifier are configured to receive an input signal via the two input resistors, and further wherein the input signal is generated by a sense resistor, the method comprising:

generating, with two current sources of an input common mode biasing circuit for an output stage of the front end differential amplifier, currents for biasing the output stage of the front end differential amplifier;

detecting a common mode voltage of the sense resistor; and generating supply rails for the front end differential amplifier based on the common mode voltage.

23. The method of claim 22, further comprising generating the supply rails for the front end differential amplifier with supply regulators, wherein a reference voltage for the supply regulators is set based on the common mode voltage.

24. The method of claim 23, wherein the supply rails are alternating-current coupled to the common mode voltage.

25. The method of claim 22, wherein:

the system further comprises a back end differential amplifier coupled to an output of the front end differential amplifier; and the method further comprises biasing an output stage of the back end differential amplifier with an output common mode biasing circuit.

26. A method in a system comprising a front end differential amplifier having two input terminals, and two input resistors, each of the two input resistors coupled to a respective one of the two input terminals, and wherein the two input terminals of the front end differential amplifier are configured to receive an input signal via the two input resistors, and further wherein the input signal is generated by a sense resistor, the method comprising:

generating, with two current sources of an input common mode biasing circuit for an output stage of the front end differential amplifier, currents for biasing the output stage of the front end differential amplifier;

detecting a common mode voltage of the sense resistor; and setting a reference voltage for virtual grounds of the front end differential amplifier based on the common mode voltage.

* * * * *